United States Patent [19]
Röschmann

[11] Patent Number: 4,698,595
[45] Date of Patent: Oct. 6, 1987

[54] NMR-APPARATUS WITH AN ADJUSTABLE RF TUNING CIRCUIT

[75] Inventor: Peter Röschmann, Hamburg, Fed. Rep. of Germany

[73] Assignee: U.S. Philips Corporation, New York, N.Y.

[21] Appl. No.: 735,006

[22] Filed: May 17, 1985

[30] Foreign Application Priority Data

Jun. 13, 1984 [DE] Fed. Rep. of Germany ....... 3421830

[51] Int. Cl.[4] ............................................. G01R 33/08
[52] U.S. Cl. .................................................... 324/313
[58] Field of Search ................ 318/556; 361/281, 287, 361/289, 300; 324/313, 309

[56] References Cited

U.S. PATENT DOCUMENTS

| 1,875,329 | 9/1932 | Chireix | 361/281 X |
| 3,447,047 | 5/1969 | Lindsay | 361/289 |
| 4,312,025 | 1/1982 | Boyer | 361/289 |
| 4,545,384 | 10/1985 | Kawochi | 324/313 X |

FOREIGN PATENT DOCUMENTS 0894506 12/1981 U.S.S.R. ............... 324/313

Primary Examiner—Michael J. Tokar
Assistant Examiner—Francis J. Jaworski
Attorney, Agent, or Firm—Robert T. Mayer; Algy Tamoshunas

[57] ABSTRACT

The invention relates to a drive mechanism for adjusting an element by means of which the resonance frequency in an NMR-apparatus can be varied. The mechanism comprises a coil which is exposed to the main magnetic field off the NMR-apparatus. The coil is connected to a current-pulse supply and is deflected out of its rest position by the current pulses. The reciprocating movement of the coil is converted by a stepping mechanism into a stepwise rotary or translational movement of the adjusting element which tunes or matches the RF coil to the RF generator.

8 Claims, 6 Drawing Figures

NMR-APPARATUS WITH AN ADJUSTABLE RF TUNING CIRCUIT

BACKGROUND OF THE INVENTION

The invention relates to an NMR-apparatus comprising a magnet for generating a steady uniform main magnetic field, a resonator arrangement for generating an RF magnetic field which is oriented at least substantially perpendicularly to the main magnetic field, and at least one drive mechanism for an adjusting-element which mechanism drives the adjusting element for matching the resonator to an RF generator and/or for adjusting the resonator tuning.

FIG. 1 shows a NMR apparatus of this type. It comprises an electromagnet 1 with four coils which generates a steady uniform magnetic field oriented in the same direction as the common horizontal coil axis. A patient 3 positioned on a table top in the interior of the electromagnetic is enclosed by an RF coil 4, which generates an RF pulsating field which is oriented perpendicularly to the main magnetic field generated by the electromagnet. The frequency of the RF magnetic field is proportional to the flux density of the main magnetic field, which may be between 0.1 T and 2 T, depending on the construction of the electromagnet. The proportionally constant is equal to the gyromagnetic ratio. This enables nuclear spin resonance to be obtained inside the volume enclosed by the RF coil. Four gradient coils 5, which generate a magnetic field which is oriented in the same direction as the main magnetic field and which varies linearly in this direction, ensure that this excitation is restricted to a vertical layer 6.

In such apparatuses it is important that the frequency of the RF field generated by the RF coil corresponds exactly to the nuclear spin resonance frequency, dictated by the gyromagnetic ratio and the flux density of the main magnetic field, and that the resonator comprising the RF coil 4 is always matched to the RF generator which energizes the RF coil.

However, depending on the size and region of the body of the patient to be examined, the resonance frequency may change and the quality factor of the resonator may decrease. This effect is produced as a result of the dielectric properties and the electrical conductivity of the body tissues. As a result of this, the RF generator and the RF receiver, which is subsequently connected to the resonator and which receives the spin resonance signal originating from the body region to be examined, are no longer matched to the resonator at the spin-resonance frequency.

After the patient has been positioned and before the actual NMR examination is started, it is therefore necessary to re-tune the RF generator to the predetermined spin-resonance frequency and to match the resonator to the RF generator. This is possible by means of the electrical circuit shown in FIG. 2. The resonator comprises the coil 5 as well as a capacitor 9 and a variable capacitor 7, arranged in parallel with the coil 5. In the case of a suitable dimensioning the capacitor 9 may be dispensed with. Via a variable capacitor 8, this resonator is connected to an RF generator 10. Matching is effected by means of the variable capacitor 8 and tuning is effected by means of the variable capacitor 7, the two adjustments being interdependent.

Adjusting the variable capacitors is difficult. These capacitors are arranged outside the RF coil inside the electromagnet and cannot be adjusted by means of stepping motors or the like, because the ferromagnetic parts thereof would disturb the homogeneity of the magnetic field. Therefore, the stepping motors must be arranged outside the electromagnet at a distance such that they do not affect the homogeneity of the main magnetic field and their operation is not disturbed by stray fields of the electromagnet. Therefore, the stepping motors have to be coupled to the adjusting elements inside the electromagnet via long actuating rods. It is not possible to arrange the adjustable elements outside the electromagnet, because then they would have to be connected to the resonator in the interior via electrical leads whose length (in particular in the case of high magnetic flux densities and high spin-resonance frequencies) is no longer small in comparison with the wavelength and thus would give rise to disturbances.

It is the object of the invention to construct an NMR apparatus of the type specified in the opening paragraph in such a way that the drive mechanism for adjusting the adjusting elements can be arranged inside the electromagnet without affecting the homogeneity of the main magnetic field.

SUMMARY OF THE INVENTION

This object is achieved in that the drive mechanism for the adjustable element comprises a movably supported coil which is exposed to the main magnetic field. The coil is connected to a current-pulse supply means for the supply of current pulses of one polarity or the other polarity, by means of which the coil is deflected out of its rest position in one direction or the other direction. The deflection movement is transmitted to the adjustable element via a stepping mechanism which converts the reciprocating movement of the coil into a stepwise movement of the adjusting element, which stepwise movement has a direction which corresponds unambiguously to the direction of the deflection.

When a current pulse is sent through the coil, the coil is deflected out of its rest position in the main magnetic field and after the current pulse has ceased it is returned to its rest position, for example by means of return springs. If several current pulses of the same polarity are applied to the coil, it will perform a reciprocating movement. By means of the stepping mechanism this movement is converted into a stepwise (rotational or translational) movement of the adjusting element, whose direction corresponds unambiguously to the direction of the deflection and hence to the polarity of the current pulses. Such a drive mechanism does not require the use of any ferromagnetic parts. Therefore, and because the leads from the current-pulse supply means to the coil are not energized during the actual measurement, such a drive mechanism does not affect the field uniformity.

BRIEF DESCRIPTION OF THE DRAWINGS

An embodiment of the invention will now be described in more detail, by way of example, with reference to the accompanying drawings. In the drawings

DESCRIPTION OF THE PREFERRED EMBODIMENTS

Figure 3:
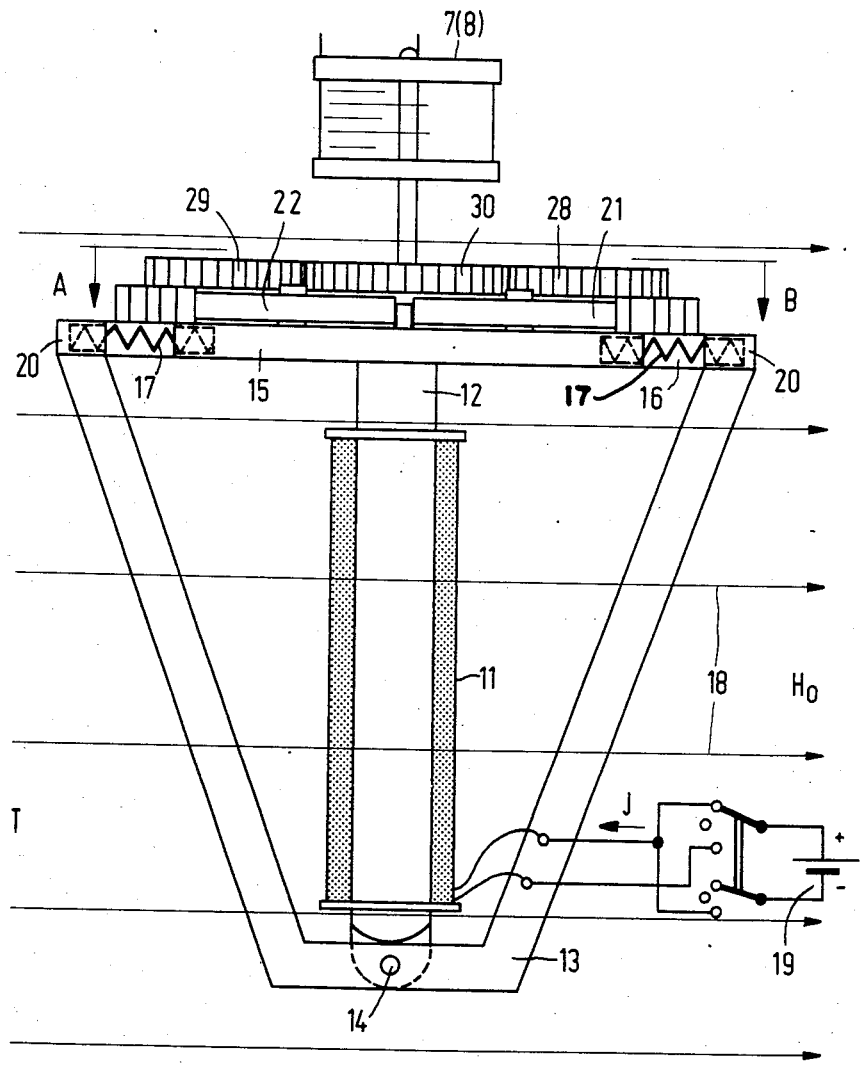
FIG. 3 shows a first embodiment of the invention.

FIG. 3 shows an elongate solenoid coil 11 arranged on a coil former 12, whose lower end is connected to a housing frame 13 so as to be pivotable about a horizontal axis 14. The upper end of the coil former 12 is connected to an actuating member 15 in such a way that a pivotal movement of the coil former 12 is converted into a sliding movement of the actuating member 15, which is guided in a horizontal guide rail 16. Two springs 17, each connected to one end of the actuating member 15, ensure that the coil former and, hence, the solenoid coil are in a vertical position in the rest position, i.e. when not subjected to any further external forces. The coil axes then extends perpendicularly to the main magnetic field, whose direction is indicated by the horizontal arrow 18 in FIG. 3.

The terminals of the coil 11 are connected to a current-pulse supply means 19, which may comprise, for example, a direct current source which can be connected to the terminals via a controllable multi-pole switch in such a way that a current flows through the coil 11 in one direction, that no current flows, or that the current flows in the opposite direction.

When a current pulse flows through the coil 11, a magnetic field is built up in the coil. That field is oriented in the direction of the coil axis and thus perpendicularly to the main magnetic field. As a result, the coil is subjected to a force which tends to tilt the coil about the axis 14 in the direction of the main magnetic field, i.e. to the left or to the right depending on the polarity of the current through the coil. This pivotal movement of the coil is transmitted to an actuating member 15 via the coil former 12, so that this member 15 slides to the left or the right along the horizontal guide rail 16. The movement of member 15 is limited by stops 20 on the ends of the guide rail, to which the actuating member is connected via springs 17. If a plurality of current pulses of the same polarity is applied to the coil 11, the actuating element 15 will perform a reciprocating movement from the center to the left (or right) and back. This reciprocating movement is converted into a stepwise rotation of the rotor of the variable capacitor 7 or 8 by the stepping mechanism, so that the capacitance of this capacitor increases or decreases stepwise depending on the polarity of the current pulses.

Figure 4:
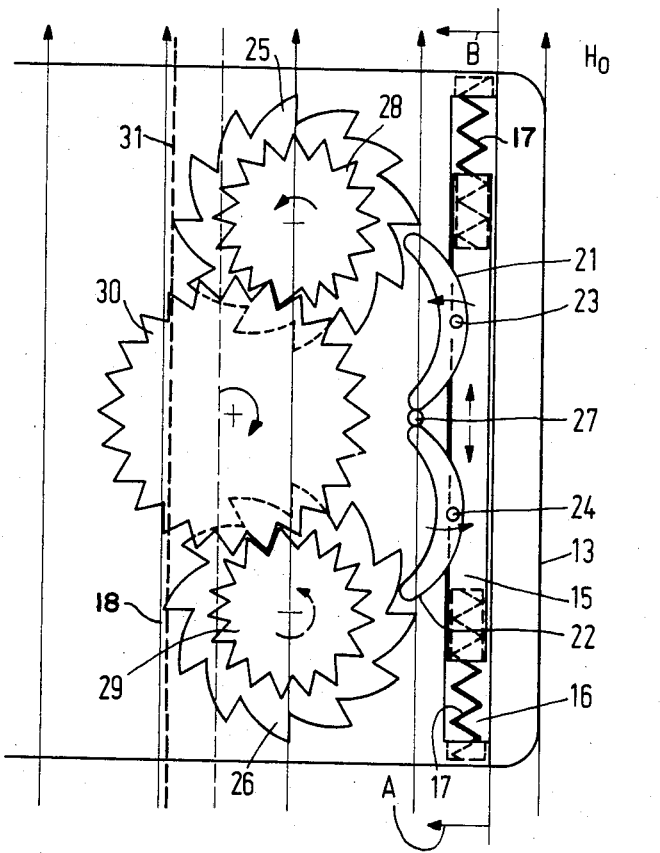
FIG. 4 is a plan view of the arrangement of FIG. 3, taken on the line A—B.

As can be seen in FIG. 4, the actuating member 15 carries two ratchets 21 and 22, which are arranged symmetrically relative to the center of the actuating member 15 and which are pivotable about vertical pins 23 and 24, respectively. Springs, not shown, urge the ratchet ends which are remote from each other against two ratchet wheels 25 and 26, respectively. The ratchet wheels are offset from one another in the direction of the magnetic field and are mounted so as to be rotatable about vertical axes symmetrically relative to the rest position of the actuating member 15. A control pin 27, which is rigidly connected to the frame 13, is situated between the facing ends of the ratchets 21 and 22.

If the coil is energized with a current pulse, which causes the actuating member 15 to be moved to the right (FIG. 3) or upwards (FIG. 4), the following will happen: As the end of ratchet 21 is disengaged from the control pin 27 during of member 15, the ratchet will follow the circumference of the ratchet wheel until it butts against a flank of a ratchet tooth and rotates the ratchet wheel 25 anti-clockwise over one tooth pitch. This movement of member 15 causes the other ratchet 22 to be pressed against the control pin 27, so that this ratchet is simultaneously pivoted anti-clockwise about the pivot pin 24. Due to its shape at the side which faces the control pin 27, the other end of the ratchet 22 is disengaged from the ratchet wheel 26. Via a drive wheel 28, which is rigidly connected to the coaxial ratchet wheel 25, the stepwise movement of the ratchet wheel 25 is transmitted to a gear wheel 30 which is connected to the rotor of the variable capacitor 7 or 8 (FIG. 3). The gear wheel 30 meshes with a gear wheel 29, which is connected to the ratchet wheel 26 in the same way as the gear wheel 28 to the ratchet wheel 25.

As a result of the movement of the actuating member, the gear wheel 28 is thus rotated anti-clockwise over one tooth pitch. This results in a clockwise rotation of the gear wheel 30 which depends on the transmission ratio, causing a rotation, which is equal to and which has the same direction as that of the ratchet wheel 25, of the gear wheel 29 and consequently of the ratchet wheel 26. At the end of the current pulse the actuating member returns to its rest position shown in FIGS. 3 and 4, without the positions of the gear wheels being changed. A new current pulse of the same polarity then causes a further stepwise rotation of the gear wheels in the same direction.

Alternatively, the gear wheel 30, which is connected to the rotor of the variable capacitor, may be replaced by a gear rack 31, shown in broken lines in FIG. 4. The gear rack is in mesh with the gear wheels 28 and 29 and is connected to a dielectric which, as disclosed in DE-OS 33 47 597, is moved inside a coaxial line which functions as a stub, so that the reactance thereof is varied in steps. The translational recirpocating movement of the actuating member 15 is thus converted into a stepwise translation of the gear rack 31.

Figure 5:
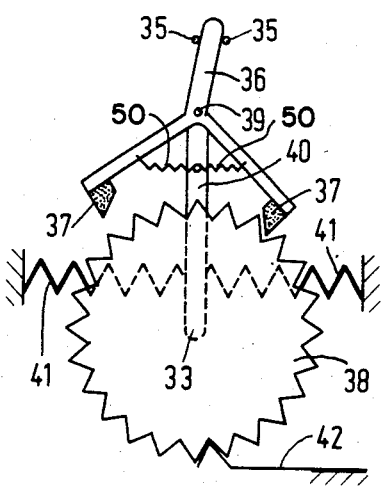
FIG. 5 shows another embodiment of the invention.
Figure 6:
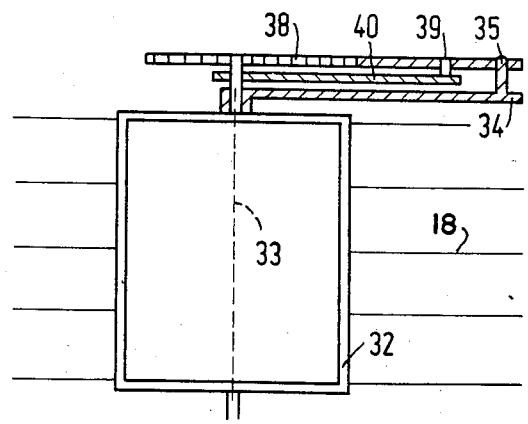
FIG. 6 is a side view of the embodiment shown in FIG. 5.

FIG. 5 and 6 show an embodiment in which the pivotal movement of the coil is converted directly, i.e. not via a translational movement. The coil 32 has one or more turns of, for example, rectangular cross-section and is rotatable about its axis of symmetry 33 which extends perpendicularly to the main magnetic field. In its rest position, the coil 32 is disposed so that the magnetic field lines 18 of the main magnetic field extend parallel to the center plane of the coil which is perpendicular to the central axis 33.

The upper end of coil 32 is rigidly connected to a lever 34, which near its end carries drive pins 35. Disposed between the pins 35 is an arm of a three-arm armature 36 whose other two arms carry ratchets 37 each cooperating with a gear wheel 38. The armature 36 is mounted on a further lever 40 so as to be rotatable about an axis 39 which is parallel to the rotational axis 33 of the coil 32. The two arms of armature 36 carrying the ratchets 37 are connected to lever 40 by springs 50 in such a way that in the rest position, those arms are disposed symmetrically with respect to lever 40. The lever 40 is again maintained in its rest position by means of springs 41. The lever 34 and the coil 32, the gear wheel 38 and the further lever 40 are rotatable about the same axis independently of each other.

When a current pulse flows in the coil 32, the coil is rotated under the influence of the force exerted on its conductors by the magnetic field, the direction of this rotation being dependent on the polarity of the current in the coil. The lever 34 is then deflected and, via the drive pins 35, it pivots the armature 36 about the axis 39 until one of the two ratchets 37 engages with the teeth of the gear wheel 38. After this, the lever 40 is pivoted in the same direction against the force of the springs 41, so that the gear wheel 38 is rotated through one step. After the current pulse has ceased the lever 40, the armature 36 and hence the lever 34 are returned to their rest positions, in which a latch 42 ensures that the gear wheel 38 retains its rotated position. Upon the next current pulse the gear wheel 38 is again rotated one tooth pitch further in the same direction.

In this way the reciprocatory pivotal movement of the lever 34 and of the coil 32 is converted into a stepwise rotation of the gear wheel 38 when the coil is energized with current pulses of a specific polarity. This rotation may be transmitted directly to the rotor of a variable capacitor or it may converted into a linear stepping movement to adjust a stub line by means of a gear rack.

Figure 1:
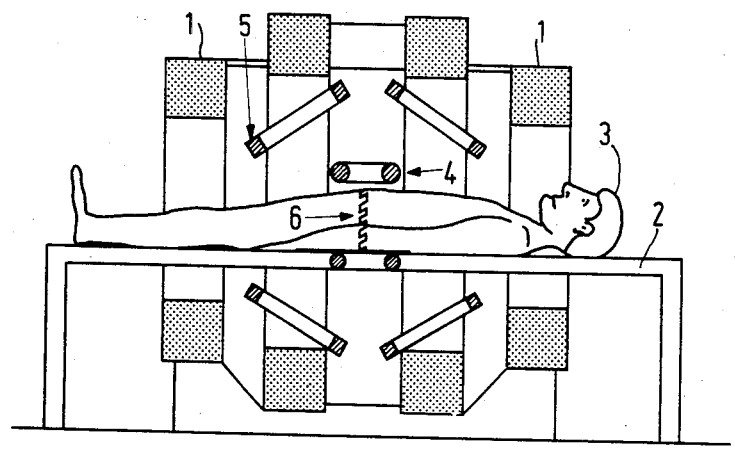
FIG. 1 shows an NMR tomography apparatus to which the invention may be applied.
Figure 2:
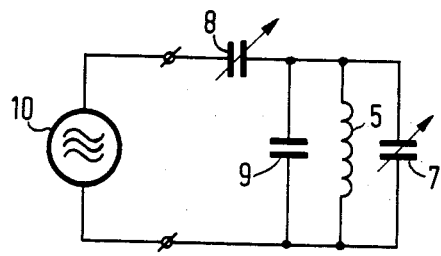
FIG. 2 shows the circuit diagram of the resonator and the RF generator.

Thus, in order to adjust the adjusting element the invention utilizes the forces exerted on an energized coil by the main magnetic field. The drive mechanism for the adjusting element in accordance with the invention comprises only non-magnetic materials and after matching or re-adjustment of the tuning, the coil is no longer energized, so that during subsequent NMR measurements no undesired fields are formed which may affect the homogeneity of the main magnetic field. This mechanism, which forms a constructional unit with the RF coil 4 (FIG. 1) and which may be replaced by another RF coil with associated drive mechanism, is particularly suitable for automatic matching or re-tuning by means of a computer, because for driving it is merely required to generate an appropriate number of current pulses.

What is claimed is:

1. An NMR apparatus comprising means for generating a steady, uniform main magnetic field, means for generating an RF magnetic field which is oriented substantially perpendicularly to said main magnetic field, means for tuning or matching said RF field generating means to an RF generator, said tuning or matching means including an electrical circuit having at least one adjustable element and means for adjusting said adjustable element, said adjusting means comprising a movably supported coil disposed in said main magnetic field, means for supplying at least one current pulse of one polarity or the other polarity to said coil so as to deflect said coil out of a rest position in one direction or the other direction in dependance on the polarity of said at least one pulse and means, coupled to said coil and said adjustable element, for converting said deflection of said coil into a stepwise movement of said adjustable element, said stepwise movement having a direction which corresponds to the direction of said deflection of said coil.

2. The apparatus according to claim 1 wherein said adjustable element is a variable capacitor.

3. An NMR apparatus as claimed in claim 1 or 2, wherein said adjustable element comprises a stub line whose properties are variable by means of a slidable dielectric and said converting means converts the movement of said coil into a stepwise sliding movement of said dielectric.

4. The apparatus according to claim 1 or 2 wherein said coil is pivotable about an axis which is substantially perpendicular to the direction of said main magnetic field, said coil having a central axis and a center plane perpendicular to said central axis and wherein, at said rest position, said center plane of said coil extends in a direction which is parallel to the direction of said main magnetic field.

5. The apparatus according to claim 4 wherein said converting means converts said pivotal movement of said coil about said axis into stepwise rotary movement.

6. The apparatus according to claim 4 wherein said converting means includes an actuating member, means for supporting said actuating member for rectilinear movement towards and away from a first position corresponding to said rest position of said coil, means for coupling said coil to said actuating member so as to cause said actuating member to move from said first position upon movement of said coil from said rest position, and means coupled to said actuating member for converting said rectilinear movement of said actuating member into a stepwise rotary movement.

7. The apparatus according to claim 1 or 2 wherein said coil has a central axis and a center plane perpendicular to said central axis, said coil being supported for rotation about an axis which is substantially perpendicular to the direction of said main field and is parallel to said center plane of said coil, and wherein, in said rest position, said center plane of said said coil extends in direction which is parallel to the direction of said main field.

8. The apparatus according to claim 7 wherein said converting means includes a rotatably mounted gear wheel and ratchet means coupled to said coil and said gear wheel for rotating said gear wheel by a predetermined amount upon rotation of said coil from said rest position when a current pulse is supplied to said coil.

* * * * *